(12) United States Patent
Hattori et al.

(10) Patent No.: US 9,349,925 B2
(45) Date of Patent: May 24, 2016

(54) LIGHT EMITTING DEVICE WITH OXYNITRIDE PHOSPHORS

(71) Applicant: Kabushiki Kaisha Toshiba, Minato-ku (JP)

(72) Inventors: Yasushi Hattori, Kawasaki (JP); Masahiro Kato, Naka (JP); Kunio Ishida, Fuchu (JP); Shinya Nunoue, Ichikawa (JP); Yumi Fukuda, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/471,352

(22) Filed: Aug. 28, 2014

(65) Prior Publication Data

US 2015/0108521 A1 Apr. 23, 2015

(30) Foreign Application Priority Data

Oct. 23, 2013 (JP) .................................. 2013-220239

(51) Int. Cl.
*H01L 33/50* (2010.01)
*C09K 11/64* (2006.01)
*C09K 11/59* (2006.01)
(Continued)

(52) U.S. Cl.
CPC ............ *H01L 33/504* (2013.01); *C04B 35/597* (2013.01); *C09K 11/0883* (2013.01); *C09K 11/7734* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3229* (2013.01); *F21K 9/56* (2013.01); *H01L 2224/48091* (2013.01); *Y02B 20/181* (2013.01)

(58) Field of Classification Search
CPC ...................................................... H01L 33/504
See application file for complete search history.

(56) References Cited

U.S. PATENT DOCUMENTS 8,740,400 B2 * 6/2014 Tao et al. ......................... 362/84
RE45,502 E * 5/2015 Sakane et al. ........... 252/301.4 F
(Continued)

FOREIGN PATENT DOCUMENTS

EP 2 489 717 A1 8/2012
EP 2 778 507 A1 9/2014
(Continued)

OTHER PUBLICATIONS

Extended European Search Report issued Apr. 2, 2015 in Patent Application No. 14180256.1

*Primary Examiner* — Victor A Mandala
*Assistant Examiner* — Regan J Rundio
(74) *Attorney, Agent, or Firm* — Oblon, McClelland, Maier & Neustadt, L.L.P (57) ABSTRACT

A light emitting device according to embodiments includes a light emitting element emitting light with a peak wavelength of 420~445 nm, a first phosphor emitting light with a peak wavelength of 485~530 nm, a second phosphor emitting light with a peak wavelength of 530~580 nm, and a third phosphor emitting light with a peak wavelength of 600~650 nm. The device emits light having an emission spectrum that has a local minimum value of light intensity between a wavelength of 450~470 nm or less, the local minimum value being 60% or less of a maximum value of light intensity at a longer wavelength side from the local minimum value, and the device emits light having a color temperature of 4600 K or higher and 5400 K or less.

14 Claims, 6 Drawing Sheets

(51) Int. Cl.
  *C09K 11/78* (2006.01)
  *C09K 11/79* (2006.01)
  *C09K 11/80* (2006.01)
  *C04B 35/597* (2006.01)
  *C09K 11/08* (2006.01)
  *C09K 11/77* (2006.01)
  *H05B 33/14* (2006.01)
  *F21K 99/00* (2016.01)

(56) References Cited

U.S. PATENT DOCUMENTS

| | | | |
|---|---|---|---|
| 2008/0128654 | A1 | 6/2008 | Oshio |
| 2012/0018764 | A1* | 1/2012 | Choi et al. ................ 257/99 |
| 2012/0062106 | A1 | 3/2012 | Okada et al. |
| 2012/0112626 | A1 | 5/2012 | Sakuta et al. |
| 2013/0050980 | A1 | 2/2013 | Kato et al. |
| 2013/0343059 | A1* | 12/2013 | Usui et al. ................ 362/293 |
| 2014/0293577 | A1 | 10/2014 | Yamakawa et al. |
| 2014/0307417 | A1* | 10/2014 | Yamakawa et al. ........... 362/84 |

FOREIGN PATENT DOCUMENTS

| | | |
|---|---|---|
| JP | 2011-155297 | 8/2011 |
| JP | 4825923 B2 | 11/2011 |
| JP | 2012-56970 | 3/2012 |
| JP | 2012-64860 | 3/2012 |
| JP | 2012-77291 | 4/2012 |
| JP | 2013-43937 | 3/2013 |
| WO | WO 2012124480 A1 * | 9/2012 |
| WO | WO 2013/061943 A1 | 5/2013 |
| WO | WO 2013069435 A1 * | 5/2013 |

* cited by examiner

LIGHT EMITTING DEVICE WITH OXYNITRIDE PHOSPHORS

CROSS-REFERENCE TO RELATED APPLICATION

This application is based upon and claims the benefit of priority from Japanese Patent Application No. 2013-220239, filed on Oct. 23, 2013, the entire contents of which are incorporated herein by reference.

FIELD

Embodiments described herein relate generally to a light emitting device.

BACKGROUND

A light emitting device using a light emitting diode (LED) is made generally of a combination of an LED chip as an excitation light source and a phosphor excited by the excitation light. Light with various colors can be realized by changing the combination.

A white light emitting device emitting white light uses a combination of a blue LED emitting blue light and a phosphor, for example. In a white light emitting device, a blue LED having a peak wavelength around 460 nm is generally used to realize high excitation efficiency of a phosphor.

On the other hand, light around 460 nm accelerates a secretion of melatonin from a human body. Therefore, it is concerned that use of the white light emitting device may alter a biological rhythm.

DETAILED DESCRIPTION

A light emitting device according to embodiments includes a light emitting element emitting light with a peak wavelength of 420 nm or more and 445 nm or less, a first phosphor emitting light with a peak wavelength of 485 nm or more and less than 530 nm, a second phosphor emitting light with a peak wavelength of 530 nm or more and less than 580 nm, and a third phosphor emitting light with a peak wavelength of 600 nm or more and less than 650 nm. The device emits light having an emission spectrum that has a local minimum value of light intensity between in the range of a wavelength of 450 nm or more and 470 nm or less, the local minimum value being 60% or less of a maximum value of light intensity at a longer wavelength side from the local minimum value, and the device emits light having a color temperature of 4600 K or higher and 5400 K or less.

In the present specification, a peak wavelength of the light emitting element and the phosphor means a wavelength where the light intensity becomes the maximum in a distribution of light emitted from the light emitting element or the phosphor. The peak wavelength and the light intensity can be measured by using a known optical spectrum analyzer or an optical power meter.

In the present specification, the emission spectrum means a distribution of light intensity to a wavelength.

Hereinafter, embodiments will be described with reference to the drawings.

First Embodiment

A light emitting device according to the present embodiment includes a light emitting element emitting light with a peak wavelength of 420 nm or more and 445 nm or less, a first phosphor emitting light with a peak wavelength of 485 nm or more and less than 530 nm, a second phosphor emitting light with a peak wavelength of 530 nm or more and less than 580 nm, and a third phosphor emitting light with a peak wavelength of 600 nm or more and less than 650 nm. The device emits light having an emission spectrum that has a local minimum value of light intensity between in the range of a wavelength of 450 nm or more and 470 nm or less, the local minimum value being 60% or less of a maximum value of light intensity at a longer wavelength side from the local minimum value, and the device emits light having a color temperature of 4600 K or higher and 5400 K or less.

Figure 1:
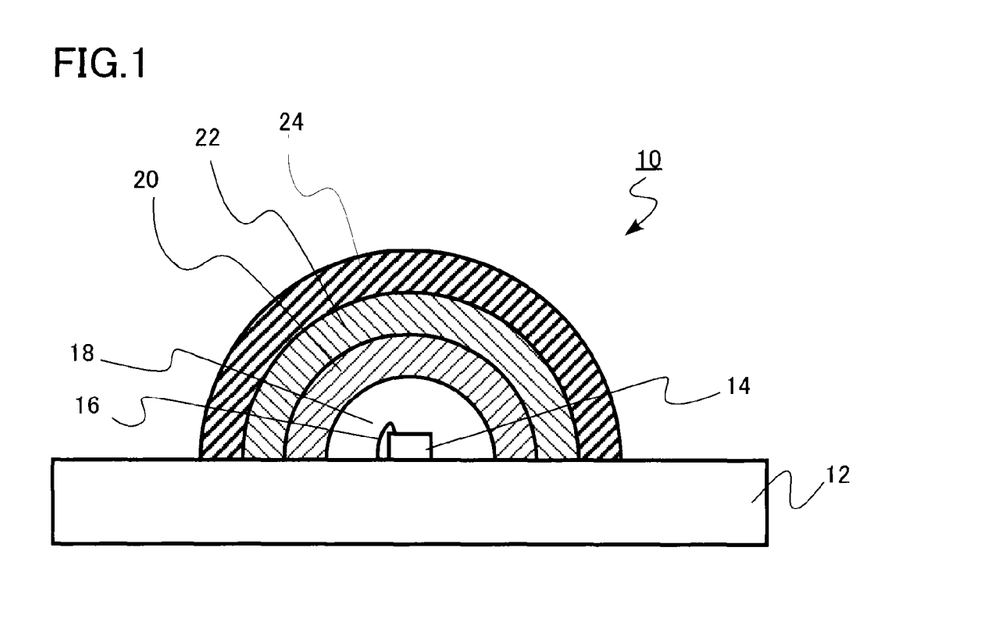
FIG. 1 is a schematic sectional view of a light emitting device according to a first embodiment.

FIG. 1 is a schematic sectional view of a light emitting device according to the present embodiment. This light emitting device, which is a device 10, is a white light emitting device which emits white light. Particularly, the light emitting device 10 is a white light emitting device (white LED) emitting white light having a white daylight color with a color temperature of 4600 K or higher and 5400 K or lower.

The light emitting device 10 has a substrate 12 having a plane on which a light emitting element is to be mounted. For the substrate 12, for example, a highly reflective material is used.

The light emitting element 14 emits light having a peak wavelength of 420 nm or more and 445 nm or less. As the light emitting element 14, for example, a blue LED is mounted on the plane of the substrate 12. The blue LED is connected to an interconnect not illustrated by, for example, a golden wire 16. When a driving current is supplied from the outside through the interconnect to the blue LED, the blue LED generates excitation blue light.

The blue LED is, for example, an AlGaInN based LED having a light emitting layer including GaInN.

An element sealing transparent layer 18 made of a transparent resin in a semispherical form is laid on the light emitting element 14. The transparent resin is, for example, a silicone resin.

Furthermore, a first phosphor layer 20 is formed to cover the element sealing transparent layer 18. An outer peripheral shape of the first phosphor layer 20 in a section perpendicular to the plane of the substrate 12 is semicircular. The first phosphor layer 20 contains a third phosphor that emits light with a peak wavelength of 600 nm or more and less than 650 nm by using light emitted from the light emitting element 14 as excitation light.

The third phosphor is a red phosphor. The first phosphor layer 20 is formed by dispersing particles of red phosphor into a transparent silicone resin, for example. The first phosphor layer 20 absorbs blue light generated from the blue LED, and converts this blue light into red light.

A second phosphor layer 22 is formed to cover the first phosphor layer 20. An outer peripheral shape of the second phosphor layer 22 in a section perpendicular to the plane is semicircular. The second phosphor layer 22 contains a second phosphor that emits light with a peak wavelength, which is shorter than the peak wavelength of the first phosphor, by using light emitted from the light emitting element 14 as excitation light.

The second phosphor is a yellow phosphor. The second phosphor layer 22 is formed by dispersing particles of yellow phosphor into a transparent silicone resin, for example. The second phosphor layer 22 absorbs blue light generated from the blue LED, and converts this blue light into yellow light. The peak wavelength of light emitted from the second phosphor is 530 nm or more and less than 580 nm.

A third phosphor layer 24 is formed to cover the second phosphor layer 22. An outer peripheral shape of the third phosphor layer 24 in a section perpendicular to the plane is semicircular. The third phosphor layer 24 contains a first phosphor that emits light with a peak wavelength, shorter than the peak wavelengths of the second and third phosphors, by using light emitted from the light emitting element 14 as excitation light.

The first phosphor is a green phosphor. The third phosphor layer 24 is formed by dispersing particles of green phosphor into a transparent silicone resin, for example. The third phosphor layer 24 absorbs blue light generated from the blue LED, and converts this blue light into green light. The peak wavelength of light emitted from the first phosphor is 485 nm or more and less than 530 nm.

Figure 2:
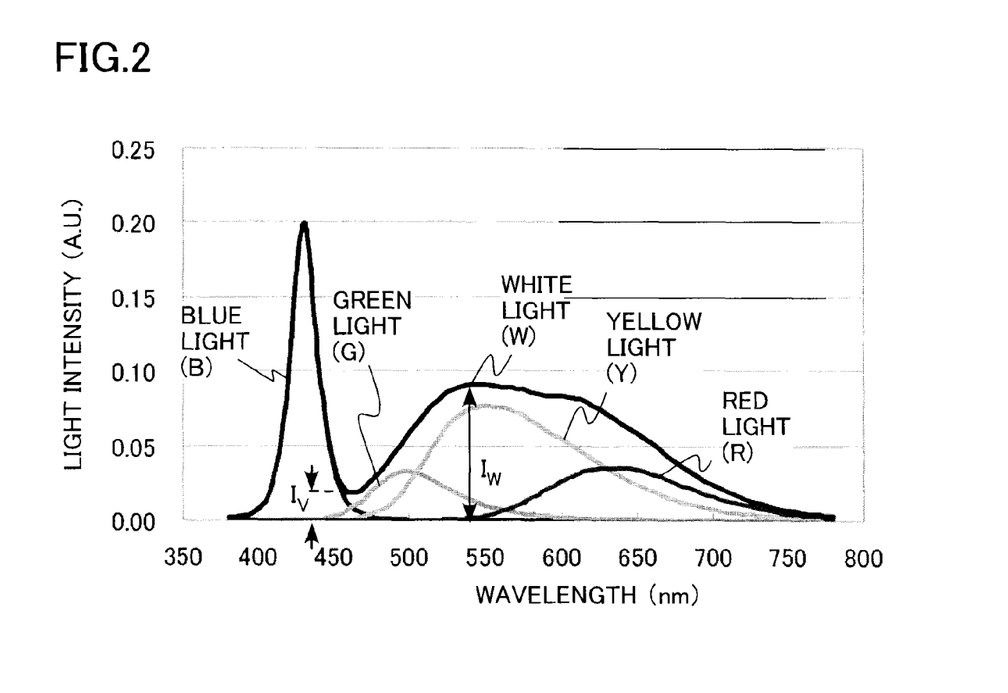
FIG. 2 is a view illustrating emission spectra of the light emitting device according to the first embodiment.

FIG. 2 is a view illustrating emission spectra of the light emitting device according to the present embodiment. FIG. 2 illustrates an emission spectrum of white light (W) emitted from the light emitting device 10. FIG. 2 also illustrates an emission spectrum of green light (G) emitted from the first phosphor (green phosphor), an emission spectrum of yellow light (Y) emitted from the second phosphor (yellow phosphor), and an emission spectrum of red light (R) emitted from the third phosphor (red phosphor).

The light emitting device 10 according to the present embodiment emits white light having a neutral white with a color temperature of 4600 K or higher and 5400 K or lower. The light emitting device 10 according to the present embodiment emits light whose intensity becomes a local minimum value (in the figure, $I_V$) between in the range of a wavelength of 450 nm or more and 470 nm or less in the emission spectrum. In other words, the emission spectrum of the light has a valley having a bottom at the wavelength of 450 nm or more and 470 nm or less. The local minimum value is 60% or less of the maximum light intensity (in the figure, $I_W$) that is located at the longer wavelength side from the local minimum value.

Figure 3:
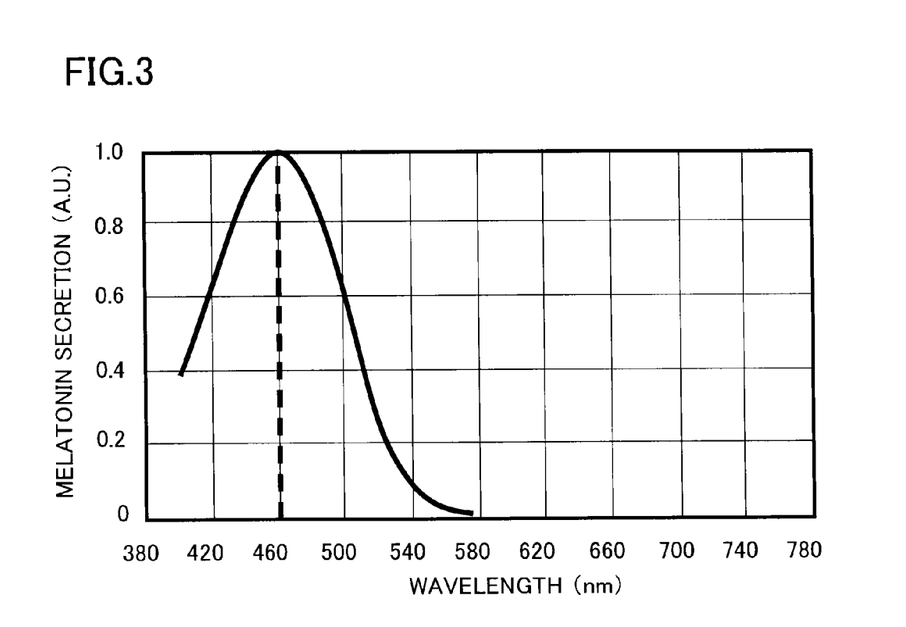
FIG. 3 is a view illustrating a relationship between a wavelength of light and a melatonin secretion.

FIG. 3 is a view illustrating a relationship between a wavelength of light and a melatonin secretion. As illustrated in FIG. 3, the melatonin secretion becomes the maximum with a wavelength of around 460 nm. Therefore, when a man is exposed to strong light having a wavelength of about 460 nm from an illumination device at night, for example, a melatonin secretion is accelerated. With this, a biological rhythm is altered, which might cause insomnia.

A light emitting device emitting light of a neutral white having a color temperature of 4600 K or higher and 5400 K or lower has strong light intensity of a blue component. Therefore, this device accelerates a melatonin secretion. Therefore, compared to a light emitting device of a incandescent, this device has great concern for the alteration of the biological rhythm.

In the light emitting device 10 according to the present embodiment, the light intensity around 460 nm is low. Accordingly, the melatonin secretion is suppressed, whereby the biological rhythm can be maintained. The light emitting device according to the present embodiment includes the light emitting element, the first phosphor, the second phosphor, and the third phosphor, each emitting light with a peak wavelength falling within the range described above. Therefore, the light emitting device has excellent luminous efficiency and high color rendering index.

A simulation result of emission spectra of the light emitting device will be described below. Since the light emitting device including the light emitting element, the first phosphor, the second phosphor, and the third phosphor, each emitting light with a peak wavelength falling within the range described above, is used, light intensity around 460 nm is suppressed and excellent luminous efficiency and high color rendering index can be realized. The simulation is performed with a procedure described below.

Firstly, an emission spectrum of the blue LED is measured. The emission spectra, excited by the blue LED, of the first phosphor (green phosphor), the second phosphor (yellow phosphor), and the third phosphor (red phosphor) are added to the emission spectrum of the blue LED. All of the first phosphor (green phosphor), the second phosphor (yellow phosphor), and the third phosphor (red phosphor) are oxynitride phosphors containing silicon (Si), aluminum (Al), and strontium (Sr), that is, so-called sialon phosphors.

In this case, the peak wavelength of the first phosphor (green phosphor) and the ratio between the peak intensities of the first phosphor (green phosphor) and the second phosphor (yellow phosphor) are used as variations for a certain emission spectrum of the blue LED, and the ratio of peak intensities among the respective phosphors is adjusted such that the emitted light has a white daylight color (Cx=0.3452, Cy=0.3517) in which the color temperature of the added emission spectrum becomes 5000 K. Further, the peak wavelength of the blue LED is changed to adjust the ratio of the peak intensities among the respective phosphors such that the emitted light has a neutral white with a color temperature of 5000 K.

The peak wavelength of the second phosphor (yellow phosphor) is fixed to 549 nm. The peak wavelength of the third phosphor (red phosphor) is fixed to 633 nm.

Figure 4:
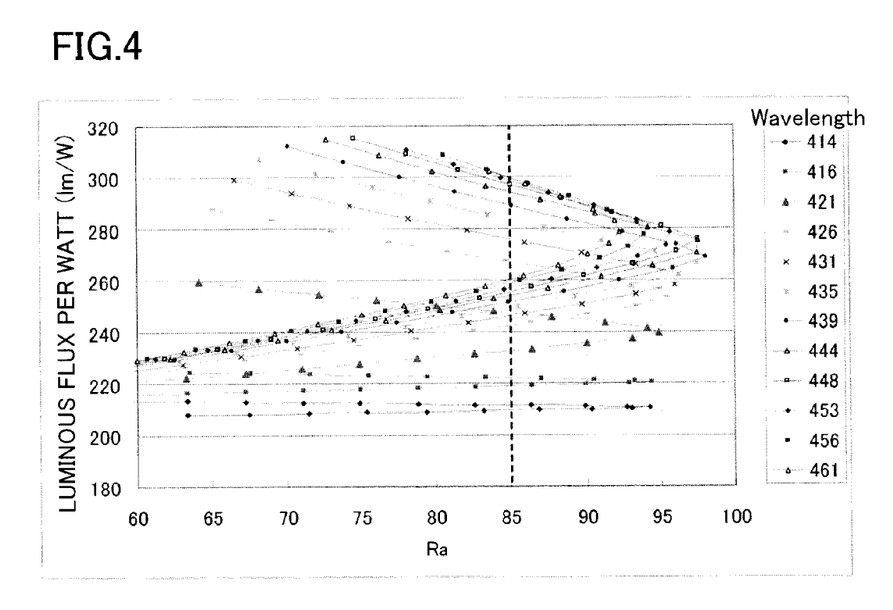
FIG. 4 is a view illustrating one example of a relationship between a luminous flux per watt and an average color rendering index (Ra) according to the first embodiment.

FIG. 4 is a view illustrating one example of a relationship between a luminous flux per watt and an average color rendering index (Ra) obtained by the simulation. FIG. 4 illustrates the relationship when the peak wavelength of the blue LED is changed.

As a result of the simulation, conditions by which the local minimum value is present at the wavelength of 450 nm or more and 470 nm or less are extracted. Among the conditions, a condition in which the ratio ($I_V/I_W$) of the light intensity between the local minimum value ($I_V$) and the maximum value ($I_W$) of the light intensity of white light, a luminous flux per watt, and an average color rendering index (Ra) are satisfactory is extracted.

Table 1 illustrates the simulation conditions and results in examples 1 to 9 extracted as described above. Table 1 illustrates peak wavelengths of the light emitting element and the respective phosphors. Table 1 also illustrates light intensities of the green phosphor, the yellow phosphor, and the red phosphor. These intensities are a value of integral of the light intensity of each phosphor, when a value of integral of the light intensity of the blue light emitting element is defined as 1.

Table 1 also illustrates the wavelength where the local minimum value is present in the emission spectrum of white light, and the ratio ($I_V/I_W$) between the intensity of the local minimum value ($I_V$) and the intensity of the maximum value ($I_W$) of white light at the long wavelength side form the local minimum value. Table 1 also illustrates a luminous flux per watt of white light and an average color rendering index (Ra).

TABLE 1

| | Blue (B) | Green (G) | | Yellow (Y) | | Red (R) | | Local minimum value | | | |
|---|---|---|---|---|---|---|---|---|---|---|---|
| | Wave length (nm) | Wave length (nm) | Intensity | Wave length (nm) | Intensity | Wave length (nm) | Intensity | Wave length (nm) | Ratio of intensities | Lumen flux per watt | Ra |
| Example 1 | 431 | 487 | 0.117 | 549 | 2.215 | 633 | 0.428 | 465 | 14% | 294 | 70 |
| Example 2 | 426 | 521 | 0.276 | 549 | 1.564 | 633 | 0.524 | 460 | 8% | 277 | 70 |
| Example 3 | 439 | 501 | 0.406 | 549 | 2.302 | 633 | 0.884 | 470 | 24% | 294 | 80 |
| Example 4 | 431 | 497 | 0.482 | 549 | 1.927 | 633 | 0.852 | 460 | 20% | 278 | 80 |
| Example 5 | 426 | 519 | 0.973 | 549 | 0.649 | 633 | 1.252 | 460 | 9% | 253 | 80 |
| Example 6 | 445 | 495 | 0.776 | 549 | 2.328 | 633 | 1.366 | 470 | 44% | 286 | 90 |
| Example 7 | 439 | 509 | 1.138 | 549 | 1.391 | 633 | 1.704 | 470 | 27% | 271 | 90 |
| Example 8 | 421 | 497 | 0.783 | 549 | 0.958 | 633 | 1.071 | 455 | 20% | 234 | 90 |
| Example 9 | 439 | 487 | 1.624 | 549 | 2.436 | 633 | 2.186 | 460 | 58% | 269 | 98 |

Figure 5A:
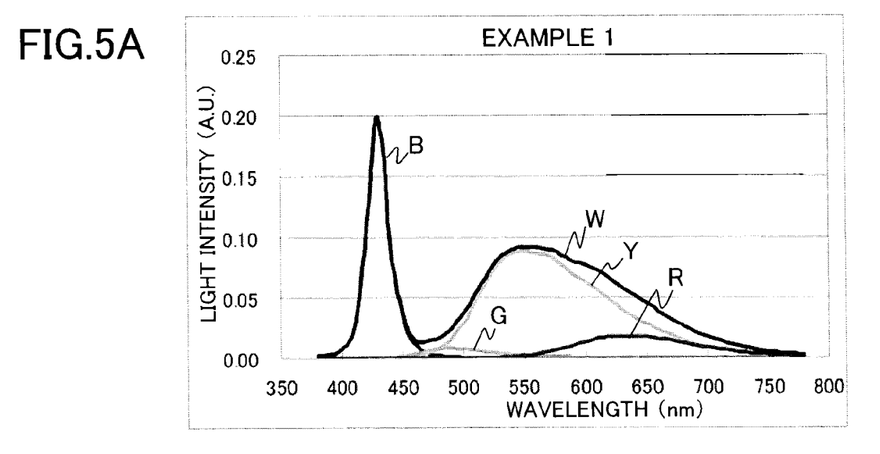
FIGS. 5A and 5B are each a chart illustrating a simulation result of emission spectra of the light emitting device according to the first embodiment.
Figure 5B:
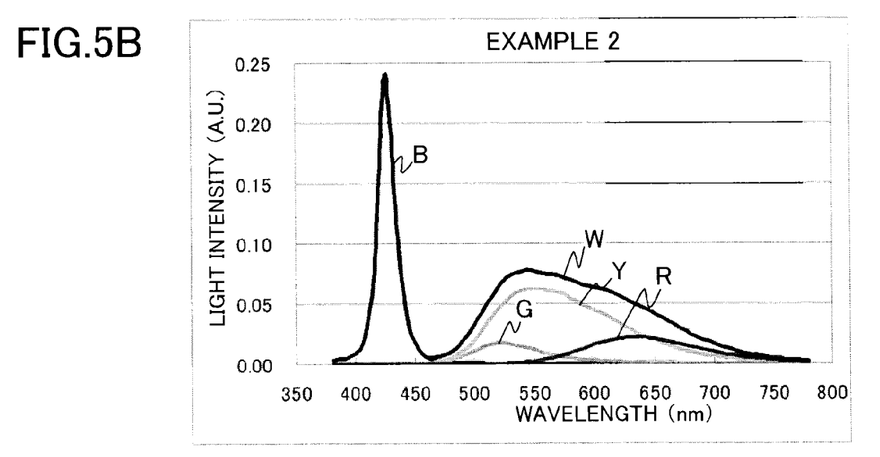
Figure 6A:
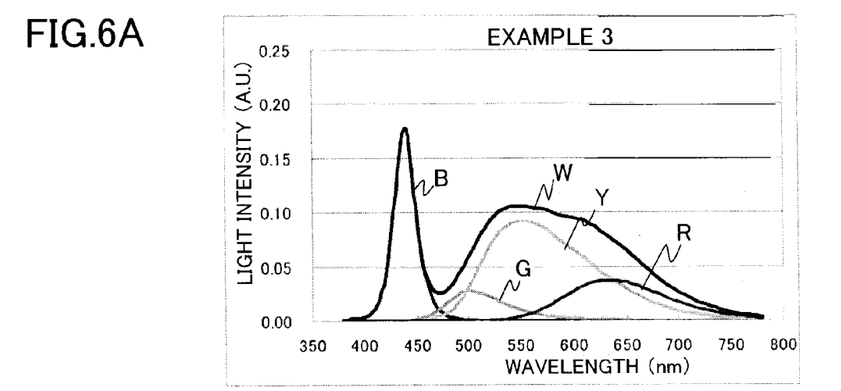
FIGS. 6A, 6B, and 6C are each a chart illustrating a simulation result of emission spectra of the light emitting device according to the first embodiment.
Figure 6B:
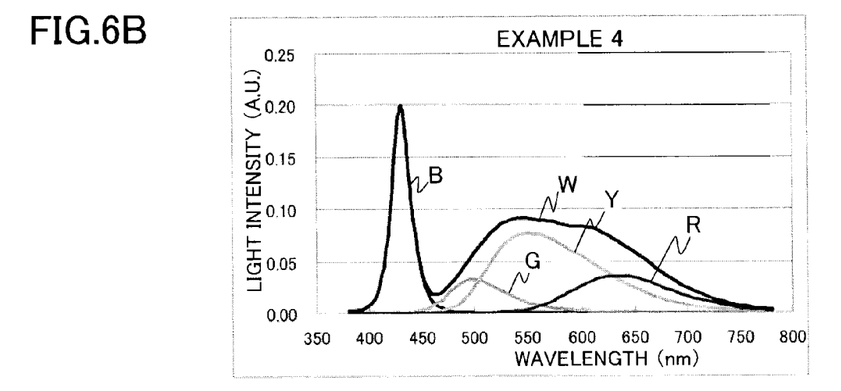
Figure 6C:
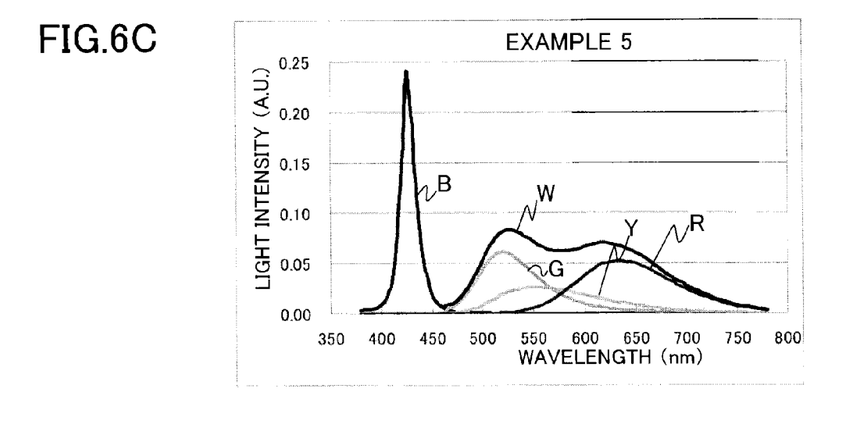
Figure 7A:
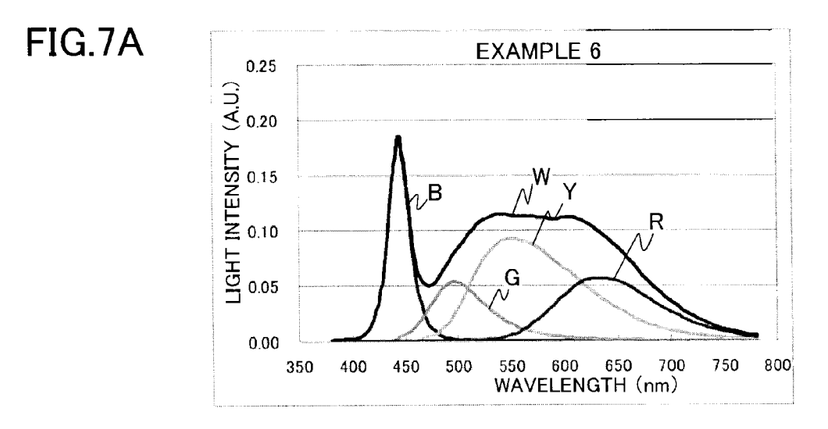
FIGS. 7A, 7B, and 7C are each a chart illustrating a simulation result of emission spectra of the light emitting device according to the first embodiment.
Figure 7B:
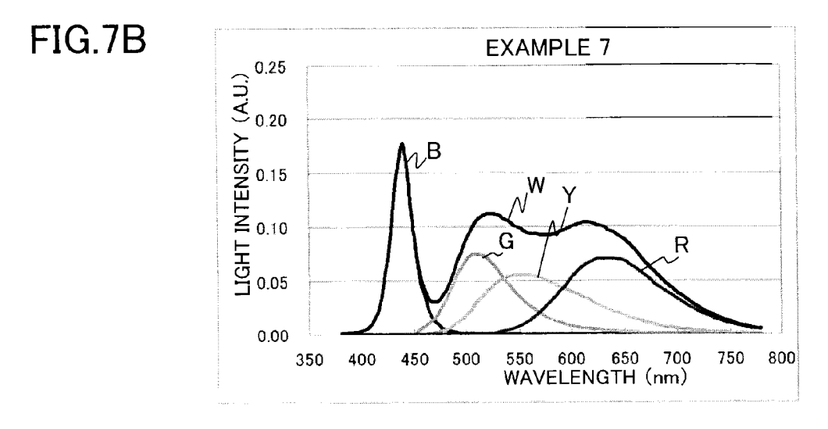
Figure 7C:
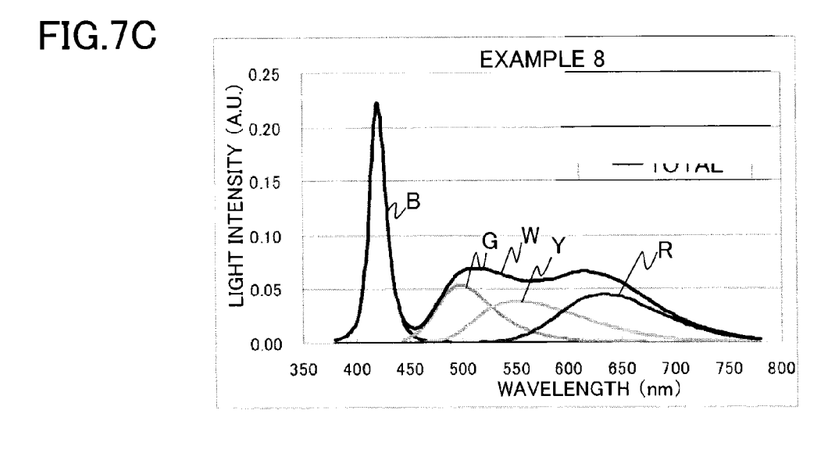
Figure 8:
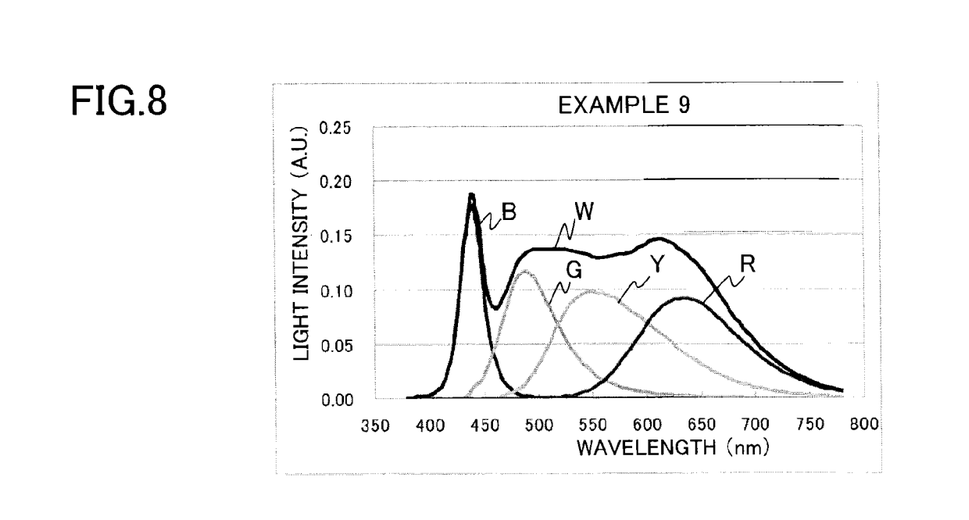
FIG. 8 is a chart illustrating a simulation result of emission spectra of the light emitting device according to the first embodiment.

FIGS. 5A, 5B, 6A, 6B, 6C, 7A, 7B, 7C, and 8 are charts illustrating the simulation results of the emission spectra in examples 1 to 9 according to the first embodiment. FIG. 5A illustrates the example 1, and FIG. 5B illustrates the example 2. FIG. 6A illustrates the example 3, FIG. 6B illustrates the example 4, and FIG. 6C illustrates the example 5. FIG. 7A illustrates the example 6, FIG. 7B illustrates the example 7, and FIG. 7C illustrates the example 8. FIG. 8 illustrates the example 9.

Since the light emitting device is used which includes the light emitting element, the first phosphor, the second phosphor, and the third phosphor, each emitting light with a peak wavelength falling within the range described above, light intensity around 460 nm is suppressed, and excellent luminous efficiency and high color rendering index (Ra) can be realized, as illustrated in Table 1 and FIGS. 5 to 8.

As illustrated in the examples 1 to 9, the peak wavelength of the light emitting element is desirably 435 nm or less from the viewpoint of reducing the ratio ($I_V/I_W$) between the local minimum value ($I_V$) of the intensity and the maximum value ($I_W$) of the intensity.

In order to decrease the local minimum value and stably realize excellent luminous efficiency and high color rendering index, it is desirable that the second phosphor (yellow phosphor) emits light with a peak wavelength of 540 nm or more and less than 560 nm, and the third phosphor (green phosphor) emits light with a peak wavelength of 620 nm or more and less than 640 nm.

The first phosphor (green phosphor) is preferably an oxynitride phosphor containing silicon (Si), aluminum (Al), and strontium (Sr), that is, a so-called sialon phosphor. This phosphor includes a matrix having a crystal structure substantially same as the crystal structure of $Sr_3Si_{13}Al_3O_2N_{21}$, and this matrix is activated with Eu.

A chemical composition of the sialon phosphor that is one example of the first phosphor (green phosphor) is represented by a general formula (1).

$$(M_{1-x1}Eu_{x1})_{3y1}Al_{z1}Si_{16-z1}O_{u1}N_{w1} \quad (1)$$

(In the general formula (1), M is Sr or M is Sr and at least one element selected from a group consisting of Ba, Ca and Mg.

x1, y1, z1, u1, and w1 satisfy the relationship described below.

$0 < x1 \leq 1$, $0.8 \leq y1 \leq 1.1$, $2 \leq z1 \leq 3.5$, $0 < u1 \leq 2$, $1.8 \leq z1 - u1$, $22 \leq u1 + w1 \leq 24$)

A sialon green phosphor that is an oxynitride phosphor containing silicon (Si), aluminum (Al), and strontium (Sr) has high exciting efficiency for excitation light with a wavelength of 420 nm or more and 445 nm or less. Therefore, when the sialon green phosphor is used as the first phosphor, high exciting efficiency can be realized even by using a short-wavelength blue LED that emits light with a peak wavelength of 420 nm or more and 445 nm or less.

The second phosphor (yellow phosphor) is preferably an oxynitride phosphor containing silicon (Si), aluminum (Al), and strontium (Sr), that is, a so-called sialon phosphor. This phosphor includes a matrix having a crystal structure substantially same as the crystal structure of $Sr_2Si_7Al_3ON_{13}$, and this matrix is activated with Ce.

A chemical composition of the sialon phosphor that is one example of the second phosphor (yellow phosphor) is represented by a general formula (2) described below.

$$(M_{1-x2}Ce_{x2})_{2y2}Al_{z2}Si_{10-z2}O_{u2}N_{w2} \quad (2)$$

(In the general formula (2), M is Sr or M is Sr and at least one element selected from a group consisting of Ba, Ca and Mg.

x2, y2, z2, u2, and w2 satisfy the relationship described below.

$0 < x2 \leq 1$, $0.8 \leq y2 \leq 1.1$, $2 \leq z2 \leq 3.5$, $0 < u2 \leq 1$ $1.8 \le z2-u2$,

$0 < w2$, $13 \le u2+w2 \le 15$)

A sialon yellow phosphor that is an oxynitride phosphor containing silicon (Si), aluminum (Al), and strontium (Sr) has high exciting efficiency for excitation light with a wavelength of 420 nm or more and 445 nm or less. Therefore, when the sialon yellow phosphor is used as the second phosphor, high exciting efficiency can be realized even by using a short-wavelength blue LED that emits light with a peak wavelength of 420 nm or more and 445 nm or less.

The third phosphor (red phosphor) is preferably an oxynitride phosphor containing silicon (Si), aluminum (Al), and strontium (Sr), that is, a so-called sialon phosphor. This phosphor includes a matrix having a crystal structure substantially same as the crystal structure of $Sr_2Si_7Al_3ON_{13}$, and this matrix is activated with Eu.

A chemical composition of the third phosphor (red phosphor) is represented by a general formula (3) described below.

$(M_{1-x3}Eu_{x3})_{2y3}Al_{z3}Si_{10-z3}O_{u3}N_{w3}$ (3)

(In the general formula (3), M is Sr or M is Sr and at least one element selected from a group consisting of Ba, Ca and Mg.

x3, y3, z3, u3, and w3 satisfy the relationship described below.

$0 < x3 \le 1$, $0.8 \le y3 \le 1.1$, $2 \le z3 \le 3.5$, $0 < u3 \le 1$ $1.8 \le z3-u3$, $0 < w3$, $13 \le u3+w3 \le 15$)

Therefore, when the oxynitride phosphor containing silicon (Si), aluminum (Al), and strontium (Sr) is used as the third phosphor, high luminous efficiency can be realized.

In the light emitting device 10 according to the present embodiment, it is desirable that the local minimum value of the emission spectrum of the emitted light is 50% or less of the maximum light intensity at the longer wavelength side from the local minimum value of the emission spectrum, more desirably 30% or less.

The light emitting device according to the present embodiment can realize a white light emitting device that has excellent luminous efficiency and high color rendering index, and can suppress a melatonin secretion.

Second Embodiment

A light emitting device according to the present embodiment is similar to that in the first embodiment except that first, second, and third phosphors are mixed and included in resin. Therefore, overlapping descriptions with the first embodiment may be skipped.

Figure 9:
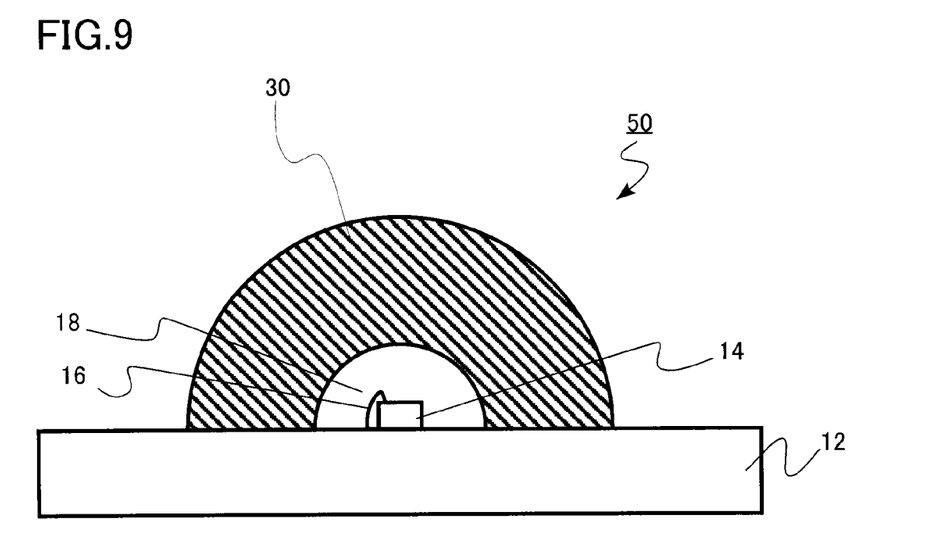
FIG. 9 is a schematic sectional view illustrating a light emitting device according to a second embodiment.

FIG. 9 is a schematic sectional view illustrating a light emitting device according to a second embodiment. This light emitting device, which is a device 50, is a white light emitting device which emits white light. Particularly, the light emitting device 50 is a white light emitting device (white LED) emitting white light having a white daylight color with a color temperature of 4600 K or higher and 5400 K or lower.

The light emitting device 50 has a phosphor layer 30 covering the element sealing transparent layer 18. An outer peripheral shape of the phosphor layer 30 in a section perpendicular to the plane is semicircular. The phosphor layer 30 is formed such that particles of the first phosphor (green phosphor), the second phosphor (yellow phosphor), and the third phosphor (red phosphor) are mixed and dispersed into a transparent silicone resin.

In the light emitting device 50 according to the present embodiment, the first, second, and third phosphors are mixed in the same resin layer. Therefore, the phosphor layer 30 is formed easier than the first embodiment.

In the light emitting device according to the present embodiment, all of the first, second, and third phosphors are desirably oxynitride phosphors containing silicon (Si), aluminum (Al), and strontium (Sr), that is, so-called sialon phosphors. When all of the first, second, and third phosphors are formed as sialon phosphors, the shape and weight of each phosphor particle become almost equal. Therefore, dispersion property and uniformity after the dispersion of the phosphor particles upon forming the phosphor layer is enhanced. Thus, a white light emitting device having uniform emission distribution can be realized.

In the embodiments, an AlGaInN based LED having an emission layer made of GaInN is used as one example. In another embodiment, an LED including an emission layer (active layer) can be used, wherein the emission layer (active layer) includes aluminum gallium indium nitride (AlGaInN), which is a Group III-V compound semiconductor, magnesium zinc oxide (MgZnO), which is a Group II-VI compound semiconductor, or some other compound.

For example, the Group III-V compound semiconductor used for the emission layer is a nitride semiconductor containing at least one selected from the group consisting of Al, Ga and In. This nitride semiconductor is specifically represented by $Al_xGa_yIn_{(1-x-y)}N$ wherein $0 \le x \le 1$, $0 \le y \le 1$, and $0 \le (x+y) \le 1$. Examples of such a nitride semiconductor include binary semiconductors such as AlN, GaN, and InN; ternary semiconductors such as $Al_xGa_{(1-x)}N$ wherein $0 < x < 1$, $Al_xIn_{(1-x)}N$ wherein $0 < x < 1$, and $Ga_yIn_{(1-y)}N$ wherein $0 < y < 1$; and quaternary semiconductors each including all of Al, Ga and In. On the basis of the values of x, y and (1−x−y), which are each related to the composition of Al, Ga or In, an emission peak wavelength is decided within the range of ultraviolet to blue wavelengths. Moreover, the Group III elements may be partially substituted with boron (B), thallium (Tl), or some other element. Furthermore, N, which is a Group V element, may be partially substituted with phosphorous (P), arsenic (As), antimony (Sb), bismuth (Bi), or some other element.

It is described above, as one example, that a silicone resin is used as the transparent material of the phosphor layer. However, any materials having high permeability of excitation light and high heat resistance can be used. Examples of the material include, besides silicone resin, epoxy resin, urea formaldehyde resin, fluorocarbon resin, acrylic resin, and polyimide resin. Epoxy resin or silicone resin is in particular preferably used since it is easily available, is easy to handle, and is inexpensive. The material may be a glass or a sintered body, for example, instead of resin.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A light emitting device comprising:
a light emitting element emitting light with a peak wavelength of 420 nm or more and 445 nm or less;
a first phosphor emitting light with a peak wavelength of 485 nm or more and less than 530 nm;
a second phosphor emitting light with a peak wavelength of 530 nm or more and less than 580 nm; and
a third phosphor emitting light with a peak wavelength of 600 nm or more and less than 650 nm,
wherein the device emits light having an emission spectrum that has a local minimum value of light intensity between in the range of a wavelength of 450 nm or more and 470 nm or less, the local minimum value being 60% or less of a maximum value of light intensity at a longer wavelength side from the local minimum value, the device emits light having a color temperature of 4600 K or higher and 5400 K or less, and the first and second phosphors are oxynitride phosphors including silicon (Si), aluminum (Al) and strontium (Sr).

2. The device according to claim 1, wherein the light emitting element is a blue LED.

3. The device according to claim 1, wherein
the second phosphor emits light with a wavelength of 540 nm or more and 560 nm or less, and
the third phosphor emits light with a wavelength of 620 nm or more and 640 nm or less.

4. The device according to claim 1, wherein the local minimum value is 50% or less of the maximum value.

5. The device according to claim 1, wherein the third phosphor is an oxynitride phosphor including silicon (Si), aluminum (Al) and strontium (Sr).

6. The device according to claim 5, wherein the light emitting element is a blue LED.

7. The device according to claim 5, wherein
the second phosphor emits light with a wavelength of 540 nm or more and less than 560 nm, and
the third phosphor emits light with a wavelength of 620 nm or more and less than 640 nm.

8. The device according to claim 5, wherein the local minimum value is 50% or less of the maximum value.

9. The device according to claim 1, wherein the light emitting element emits light with a peak wavelength of 435 nm or less.

10. The device according to claim 1, wherein a chemical composition of the first phosphor is represented by a general formula (1), $$(M_{1-x1}Eu_{x1})_{3y1}Al_{z1}Si_{16-z1}O_{u1}N_{w1} \quad (1)$$

in the general formula (1), M is Sr or M is Sr and at least one element selected from a group consisting of Ba, Ca and Mg,
x1, y1, z1, u1, and w1 satisfy a relationship below, $0 < x1 \leq 1,$ $0.8 \leq y1 \leq 1.1,$ $2 \leq z1 \leq 3.5,$ $0 < u1 \leq 2,$ $1.8 \leq z1 - u1,$ $22 \leq u1 + w1 \leq 24.$ 11. The device according to claim 1, wherein
the second phosphor emits light with a wavelength of 540 nm or more and less than 560 nm, and
the third phosphor emits light with a wavelength of 620 nm or more and less than 640 nm.

12. A light emitting device comprising:
a light emitting element emitting light with a peak wavelength of 420 nm or more and 445 nm or less;
a first phosphor emitting light with a peak wavelength of 485 nm or more and less than 530 nm;
a second phosphor emitting light with a peak wavelength of 530 nm or more and less than 580 nm; and
a third phosphor emitting light with a peak wavelength of 600 nm or more and less than 650 nm,
wherein the device emits light having an emission spectrum that has a local minimum value of light intensity between in the range of a wavelength of 450 nm or more and 470 nm or less, the local minimum value being 60% or less of a maximum value of light intensity at a longer wavelength side from the local minimum value, the device emits light having a color temperature of 4600 K or higher and 5400 K or less, a chemical composition of the first phosphor is represented by a general formula (1), and a chemical composition of the second phosphor is represented by a general formula (2), $$(M_{1-x1}Eu_{x1})_{3y1}Al_{z1}Si_{16-z1}O_{u1}N_{w1} \quad (1)$$

in the general formula (1), M is Sr or M is Sr and at least one element selected from a group consisting of Ba, Ca and Mg,
x1, y1, z1, u1, and w1 satisfy a relationship below, $0 < x1 \leq 1,$ $0.8 \leq y1 \leq 1.1,$ $2 \leq z1 \leq 3.5,$ $0 < u1 \leq 2,$ $1.8 \leq z1 - u1,$ $22 \leq u1 + w1 \leq 24;$ $$(M_{1-x2}Ce_{x2})_{2y2}Al_{z2}Si_{10-z2}O_{u2}N_{w2} \quad (2)$$

in the general formula (2), M is Sr or M is Sr and at least one element selected from a group consisting of Ba, Ca and Mg,
x2, y2, z2, u2, and w2 satisfy a relationship below, $0 < x2 \leq 1,$ $0.8 \leq y2 \leq 1.1,$ $2 \leq z2 \leq 3.5,$ $0 < u2 \leq 1$ $1.8 \leq z2 - u2,$ $0 < w2,$ $13 \leq u2 + w2 \leq 15.$ 13. The device according to claim 12, wherein a chemical composition of the third phosphor is represented by a general formula (3), $$(M_{1-x3}Eu_{x3})_{2y3}Al_{z3}Si_{10-z3}O_{u3}N_{w3} \quad (3)$$

in the general formula (3), M is Sr or M is Sr and at least one element selected from a group consisting of Ba, Ca and Mg, x3, y3, z3, u3, and w3 satisfy the relationship below, $0 < x3 \leq 1$, $0.8 \leq y3 \leq 1.1$, $2 \leq z3 \leq 3.5$, $0 < u3 \leq 1$ $1.8 \leq z3 - u3$, $0 < w3$, $13 \leq u3 + w3 \leq 15$.

14. The device according to claim 13, wherein the local minimum value is 50% or less of the maximum value.

* * * * *